(12) United States Patent
Lee et al.

(10) Patent No.: US 10,985,099 B2
(45) Date of Patent: **\*Apr. 20, 2021**

(54) SEMICONDUCTOR PACKAGES

(71) Applicant: SK hynix Inc., Icheon-si (KR)

(72) Inventors: Jae Hoon Lee, Icheon-si (KR); Ju Il Eom, Yongin-si (KR)

(73) Assignee: SK hynix Inc., Icheon-si (KR)

( \* ) Notice: Subject to any disclaimer, the term of this patent is extended or adjusted under 35 U.S.C. 154(b) by 0 days.

This patent is subject to a terminal disclaimer.

(21) Appl. No.: 16/540,940

(22) Filed: Aug. 14, 2019

(65) Prior Publication Data

US 2020/0176407 A1 Jun. 4, 2020

(30) Foreign Application Priority Data

Dec. 4, 2018 (KR) ........................ 10-2018-0154771

(51) Int. Cl.
| | |
|---|---|
| *H01L 23/49* | (2006.01) |
| *H01L 23/498* | (2006.01) |
| *H01L 23/522* | (2006.01) |
| *H01L 23/00* | (2006.01) |
| *H01L 23/50* | (2006.01) |

(52) U.S. Cl.
CPC .... *H01L 23/49838* (2013.01); *H01L 23/5226* (2013.01); *H01L 24/09* (2013.01); *H01L 23/49816* (2013.01); *H01L 23/49827* (2013.01); *H01L 23/50* (2013.01)

(58) Field of Classification Search
CPC ........... H01L 23/49838; H01L 23/5226; H01L 24/09; H01L 23/49827; H01L 23/50; H01L 23/49816; H01L 2224/13024; H01L 2224/05548; H01L 24/06; H01L 24/16

See application file for complete search history.

(56) References Cited

U.S. PATENT DOCUMENTS

| | | | |
|---|---|---|---|
| 8,120,927 | B2 | 2/2012 | Chen et al. |
| 2005/0098886 | A1 | 5/2005 | Pendse |

(Continued)

FOREIGN PATENT DOCUMENTS

| | | |
|---|---|---|
| KR | 1020100021899 A | 2/2010 |
| KR | 1020170054814 A | 5/2017 |

*Primary Examiner* — Matthew L Reames
(74) *Attorney, Agent, or Firm* — William Park & Associates Ltd.

(57) ABSTRACT

A package substrate of a semiconductor package includes second and third pad bonding portions respectively located at both sides of a first pad bonding portion on a substrate body. First to third via landing portions are spaced apart from the first to third pad bonding portions. First and second connection trace portions are disposed side by side. A first guard trace portion is substantially parallel with the first connection trace portion. The second connection trace portion is connected to the first guard trace portion through a first connection plane portion. The first connection plane portion connects the second connection trace portion to the second via landing portion. The third pad bonding portion is connected to the third via landing portion through a second connection plane portion. A semiconductor chip mounted on the package substrate includes first inner chip pads and first outer chip pads bonded to the package substrate.

20 Claims, 8 Drawing Sheets

(56) References Cited

U.S. PATENT DOCUMENTS

| | | | |
|---|---|---|---|
| 2009/0322441 A1* | 12/2009 | Chen | H01L 23/49572 |
| | | | 333/12 |
| 2015/0195906 A1* | 7/2015 | Chang | H05K 3/3436 |
| | | | 361/767 |
| 2017/0162516 A1 | 6/2017 | Joh | |
| 2018/0175016 A1 | 6/2018 | Kim et al. | |
| 2020/0176406 A1* | 6/2020 | Lee | H01L 23/49838 |

* cited by examiner

SEMICONDUCTOR PACKAGES

CROSS-REFERENCE TO RELATED APPLICATIONS

The present application claims priority under 35 U.S.C. 119(a) to Korean Application No. 10-2018-0154771, filed on Dec. 4, 2018, which is incorporated herein by references in its entirety.

BACKGROUND

1. Technical Field

The present disclosure generally relates to semiconductor packages.

2. Related Art

Each of Semiconductor packages may be configured to include a semiconductor chip mounted on a package substrate. The package substrate may include a circuit interconnection structure connected to the semiconductor chip. The circuit interconnection structure may be configured to include a ground line, a power line and signal lines transmitting electrical signals. As fast semiconductor chips operating at a high speed are required in high performance electronic systems, high frequency signals have been transmitted through the signal lines of the circuit interconnection structure. The high frequency signals have a short wave length to cause a crosstalk phenomenon between the high frequency signals. Accordingly, a method of suppressing an interference phenomenon between the signal lines may be required to provide reliable semiconductor chips.

SUMMARY

According to an embodiment, a semiconductor package includes a package substrate and a semiconductor chip mounted on the package substrate. The package substrate includes second and third pad bonding portions respectively located at both sides of a first pad bonding portion disposed on a substrate body, first to third via landing portions disposed on the substrate body to be spaced apart from the first to third pad bonding portions, a first connection trace portion extending to connect the first pad bonding portion to the first via landing portion, a second connection trace portion connected to the second pad bonding portion to be substantially parallel with the first connection trace portion, a first guard trace portion having an end portion spaced apart from the third pad bonding portion and extending to be substantially parallel with the first connection trace portion, and a first connection plane portion disposed to be spaced apart from the first via landing portion. The first connection plane portion surrounds and electrically bypasses or circumvents the first via landing portion to connect the second connection trace portion to the first guard trace portion. In addition, the first connection plane portion is disposed to connect the second connection trace portion to the second via landing portion. A second connection plane portion is disposed to connect the third pad bonding portion to the third via landing portion. The semiconductor chip includes a chip body, first inner chip pads disposed on a surface of the chip body, and first outer chip pads disposed on the surface of the chip body to be spaced apart from the first inner chip pads. The first outer chip pads are disposed to respectively overlap with the first to third pad bonding portions. In addition, the first outer chip pads are connected to respective ones of the first to third pad bonding portions. First pad connection trace portions connect the first inner chip pads to the first outer chip pads.

DETAILED DESCRIPTION

Figure 1:
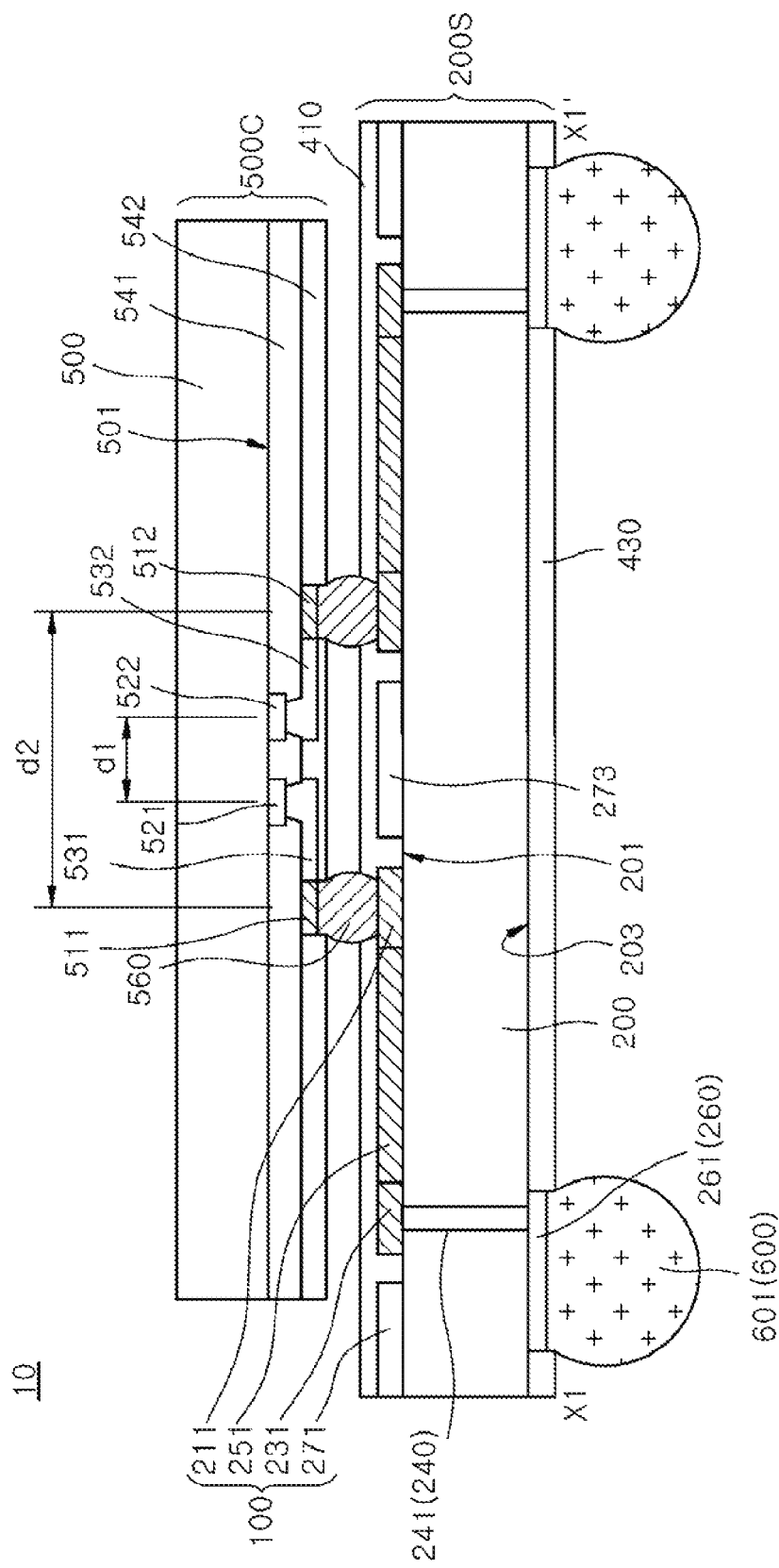
FIG. 1 is a cross-sectional view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

In the following embodiments, a semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
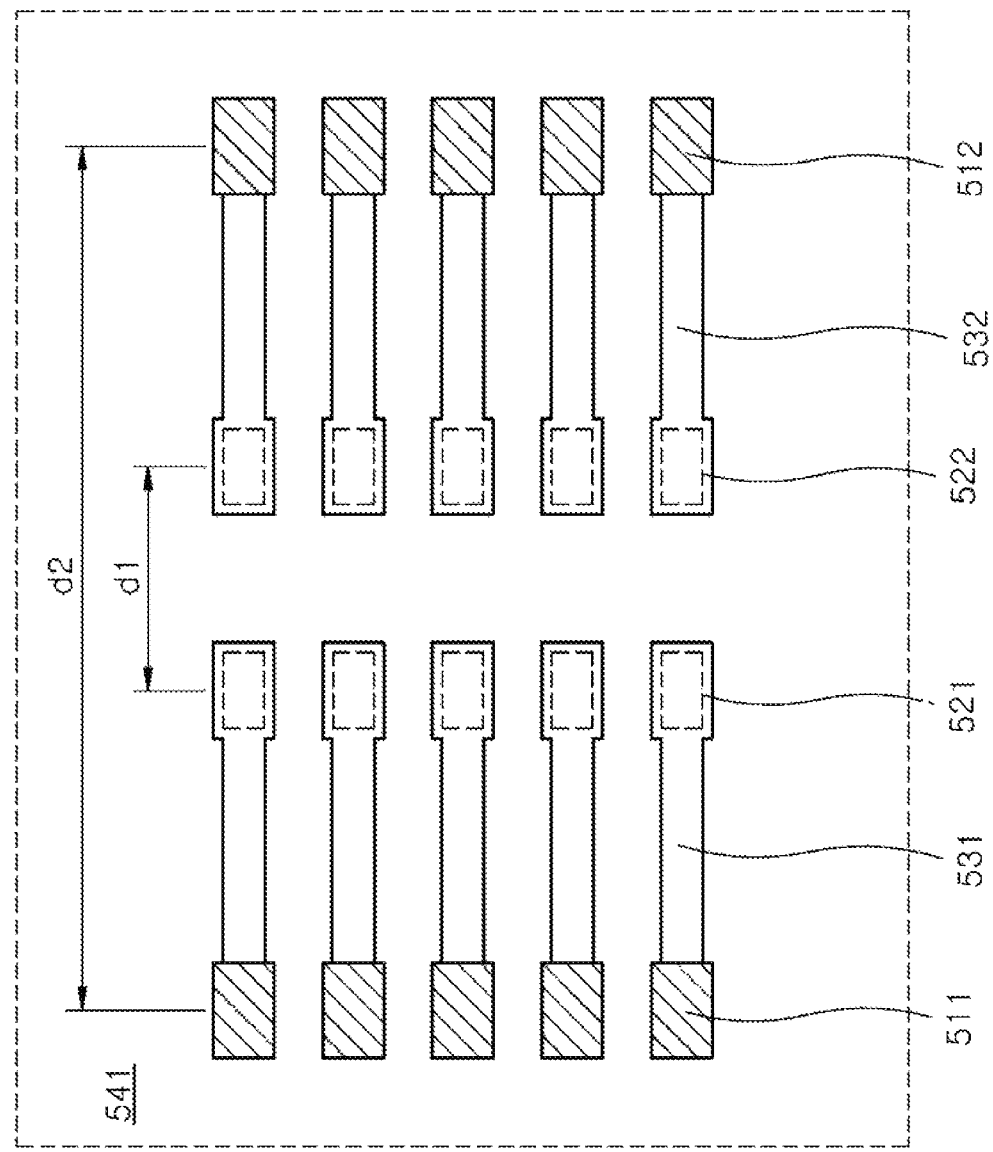
FIG. 2 is a plan view illustrating outer chip pads of a semiconductor package according to an embodiment.
Figure 3:
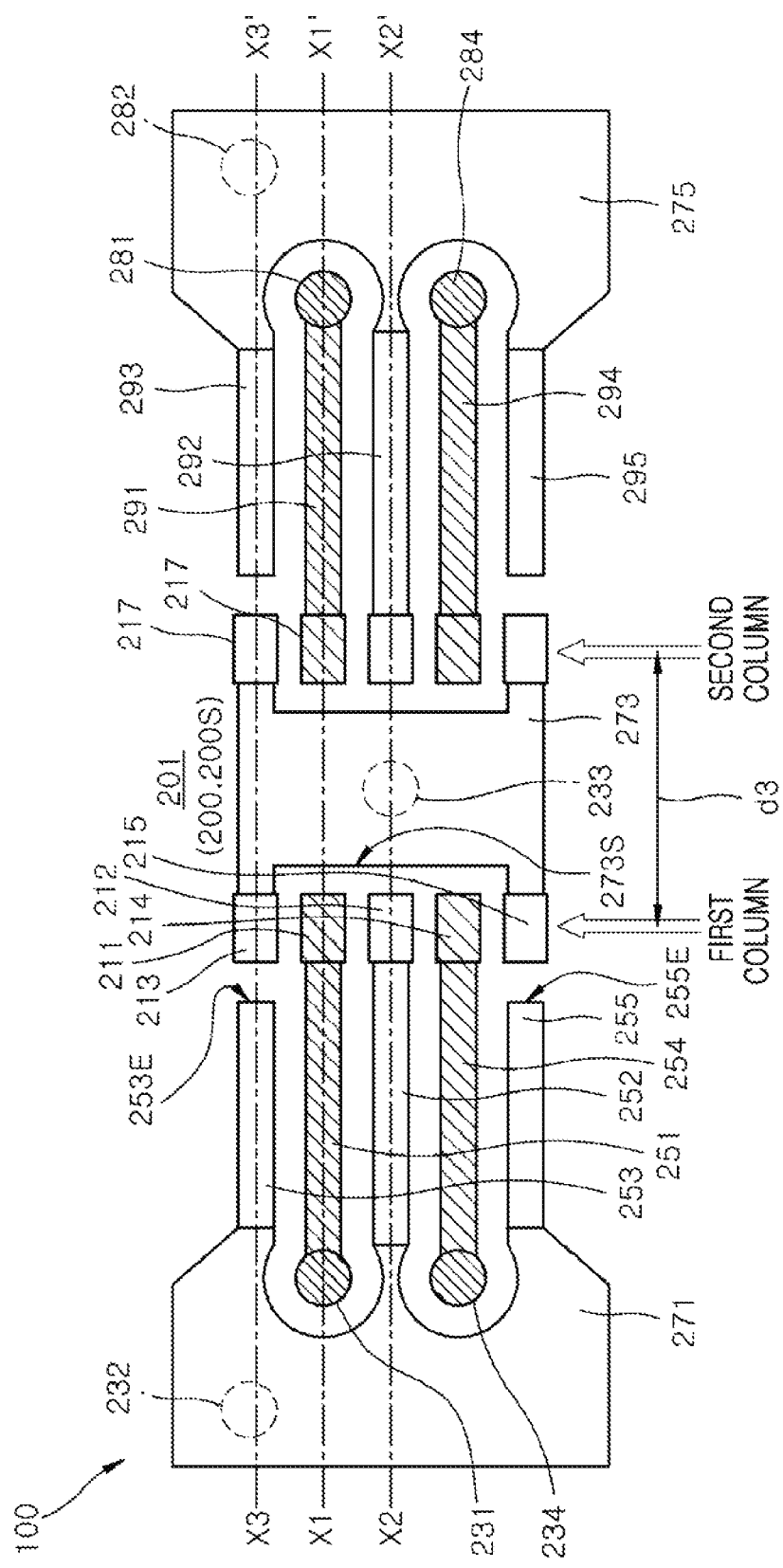
FIG. 3 is a plan view illustrating an example of a circuit interconnection structure included in a semiconductor package according to an embodiment.
Figure 4:
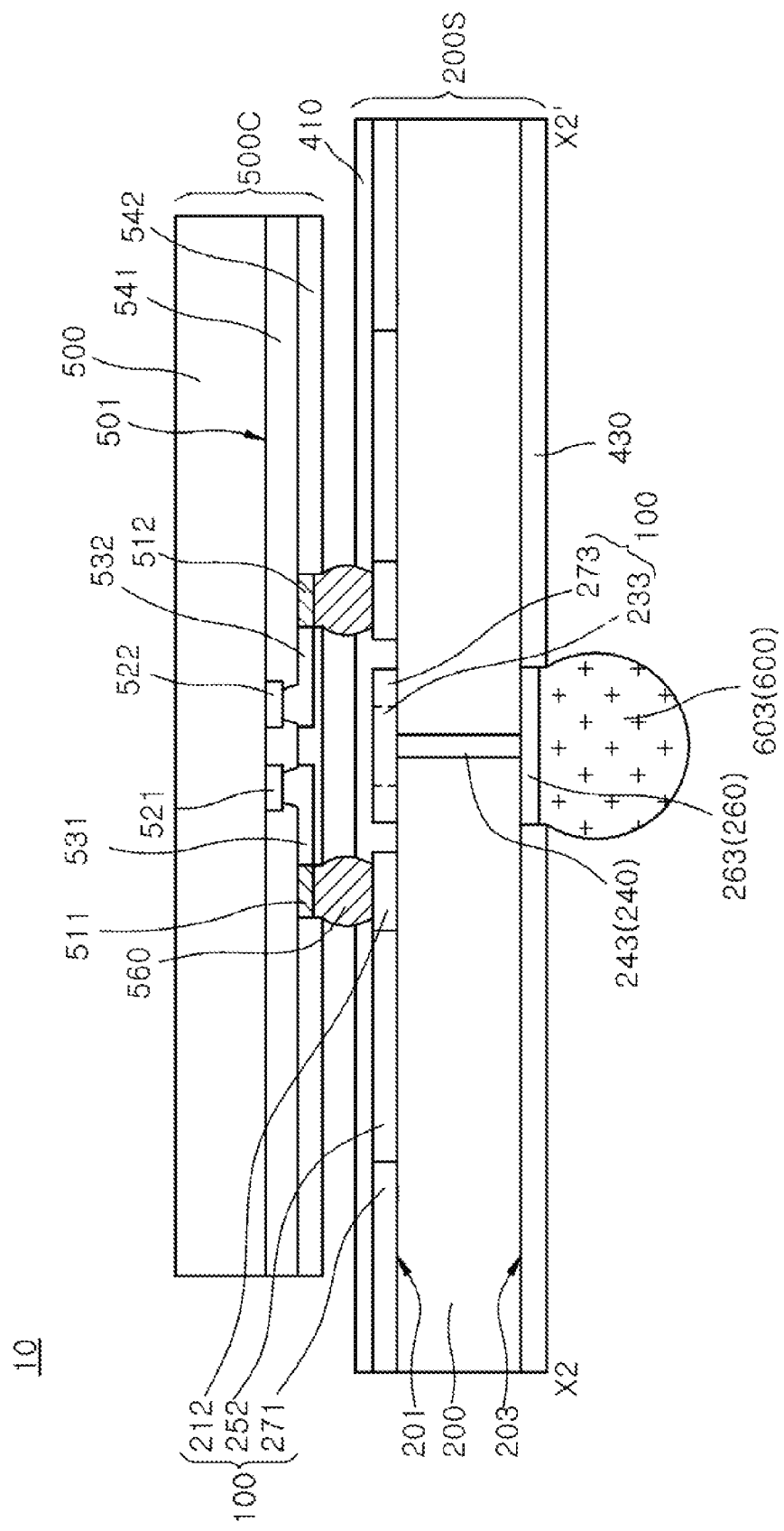
FIG. 4 is a cross-sectional view of a semiconductor package including a cross-sectional view taken along a line X2-X2' of FIG. 3.
Figure 5:
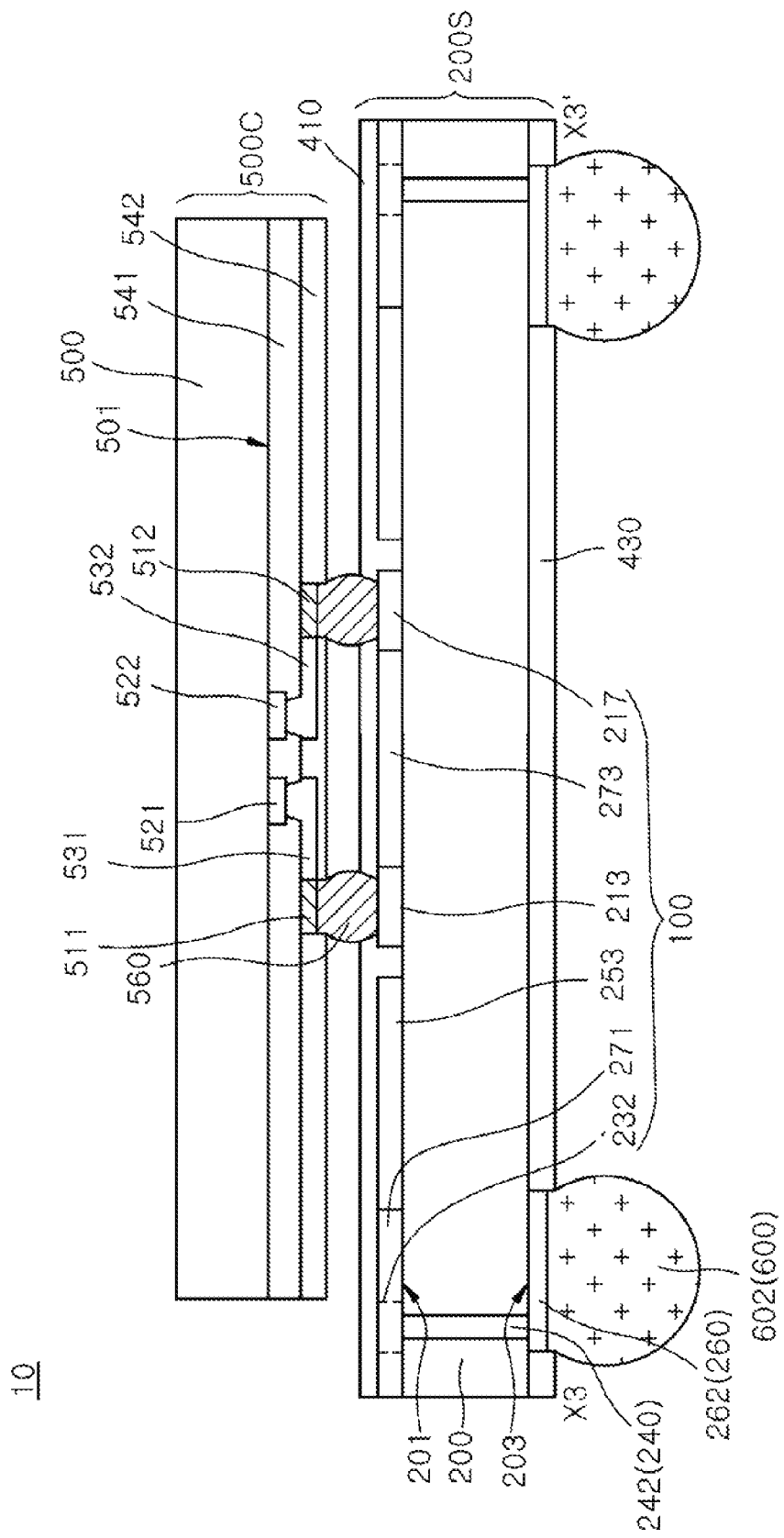
FIG. 5 is a cross-sectional view of a semiconductor package including a cross-sectional view taken along a line X3-X3' of FIG. 3.

FIG. 1 is a cross-sectional view illustrating a semiconductor package 10 according to an embodiment. FIG. 2 is a plan view illustrating first outer chip pads 511 and second outer chip pads 512 of a semiconductor chip 500C included in a semiconductor package 10 according to an embodiment. FIG. 3 is a plan view illustrating a circuit interconnection structure 100 of a package substrate 200S included in a semiconductor package 10 according to an embodiment. FIG. 1 is a cross-sectional view taken along a line X1-X1' of FIG. 3. FIG. 4 is a cross-sectional view of the semiconductor package 10 including a cross-sectional view taken along a line X2-X2' of FIG. 3. FIG. 5 is a cross-sectional view of the semiconductor package 10 including a cross-sectional view taken along a line X3-X3' of FIG. 3.

Referring to FIGS. 1 and 2, the semiconductor package 10 may be configured to include the package substrate 200S and the semiconductor chip 500C. The semiconductor chip 500C may include a chip body 500 in or on which an integration circuit is formed. First inner chip pads 521 may be disposed on a surface 501 of the chip body 500. Second inner chip pads 522 may be disposed on the surface 501 of the chip body 500 to be spaced apart from the first inner chip pads 521 and to face the first inner chip pads 521. A first dielectric layer 541 may be disposed on the surface 501 of the chip body 500 to reveal the first and second inner chip pads 521 and 522. The first dielectric layer 541 may fill a space between the first and second inner chip pads 521 and 522 to electrically isolate the first and second inner chip pads 521 and 522 from each other.

The first outer chip pads 511 may be disposed on a surface of the first dielectric layer 541 opposite to the chip body 500 to be spaced apart from the first inner chip pads 521 in a plan view (see FIG. 2). The second outer chip pads 512 may be disposed on the surface of the first dielectric layer 541 opposite to the chip body 500 to be spaced apart from the second inner chip pads 522 in a plan view (see FIG. 2). As illustrated in FIG. 2, the first and second inner chip pads 521 and 522 may be disposed between the first outer chip pads 511 and the second outer chip pads 512. A first distance d1 between the first inner chip pads 521 and the second inner chip pads 522 may be less than a second distance d2 between the first outer chip pads 511 and the second outer chip pads 512.

First pad connection trace portions 531 may be disposed on the first dielectric layer 541 to connect the first inner chip pads 521 to the first outer chip pads 511, respectively. The first pad connection trace portions 531 may correspond to redistribution lines extending from the first inner chip pads 521 to reach the first outer chip pads 511. Second pad connection trace portions 532 may be disposed on the first dielectric layer 541 to connect the second inner chip pads 522 to the second outer chip pads 512, respectively. The second pad connection trace portions 532 may also correspond to redistribution lines extending from the second inner chip pads 522 to reach the second outer chip pads 512.

A second dielectric layer 542 may be disposed on the surface of the first dielectric layer 541 opposite to the chip body 500 to cover the first and second pad connection trace portions 531 and 532. The second dielectric layer 542 may be disposed to reveal the first and second outer chip pads 511 and 512.

The first and second outer chip pads 511 and 512 may act as connection terminals for applying electrical signals to the semiconductor chip 500C. The first and second outer chip pads 511 and 512 may include signal pads for applying electrical data signals to the semiconductor chip 500C, at least one ground pad for supplying a ground voltage to the semiconductor chip 500C, and at least one power pad for supplying a power voltage to the semiconductor chip 500C.

The semiconductor chip 500C may be mounted on the package substrate 200S. The semiconductor chip 500C may be bonded to the package substrate 200S in a flip chip form such that the first and second outer chip pads 511 and 512 of the semiconductor chip 500C face the package substrate 200S. The semiconductor chip 500C may be electrically connected to the package substrate 200S through inner connectors 560 located between the semiconductor chip 500C and the package substrate 200S. The inner connectors 560 may be bumps.

Referring to FIG. 1, the package substrate 200S may act as an interconnection member that electrically connects the semiconductor chip 500C to an external device (not shown). The package substrate 200S may be provided to have a printed circuit board (PCB) structure.

The package substrate 200S may be configured to include a substrate body 200. The substrate body 200 may include a dielectric layer. The substrate body 200 may have a first surface 201 on which the semiconductor chip 500C is disposed and a second surface 203 located opposite to the semiconductor chip 500C. Outer connectors 600 may be attached to the second surface 203 of the substrate body 200. The outer connectors 600 may be interconnection members for electrically connecting the semiconductor package 10 to an external device. The outer connectors 600 may be interconnection members, for example, solder balls.

Outer connector landing portions 260 may be disposed on the second surface 203 of the substrate body 200. In such a case, the outer connectors 600 may be bonded to the outer connector landing portions 260. The outer connector landing portions 260 may be conductive patterns. A fourth dielectric layer 430 may be disposed on the second surface 203 of the substrate body 200 to reveal the outer connector landing portions 260. The fourth dielectric layer 430 may be formed to include a solder resist layer.

Conductive vias 240 may be disposed to vertically penetrate the substrate body 200. The conductive vias 240 may be electrically connected to the outer connector landing portions 260 disposed on the second surface 203 of the substrate body 200, respectively. In an embodiment, the conductive vias 240 may be electrically connected to the outer connector landing portions 260 in a one-to-one manner whereby a single conductive via 240 is connected to a single outer connector landing portion 260. The conductive vias 240 may be disposed to respectively overlap with the outer connector landing portions 260 in a plan view. Although not shown in the drawings, conductive connection trace portions may be additionally disposed on the second surface 203 of the substrate body 200 in order to electrically connect the conductive vias 240 to the outer connector landing portions 260 when the conductive vias 240 are disposed to be laterally offset relative to the outer connector landing portions 260.

Referring to FIGS. 1 and 3, the circuit interconnection structure 100 may be disposed on the first surface 201 of the substrate body 200. The circuit interconnection structure 100 may include conductive patterns. The circuit interconnection structure 100 may be disposed to electrically connect the conductive vias 240 to the inner connectors 560. The circuit interconnection structure 100 may be conductive patterns that electrically connect the conductive vias 240 to the semiconductor chip 500C. A third dielectric layer 410 may be disposed on the first surface 201 of the substrate body 200 to reveal portions of the circuit interconnection structure 100.

The circuit interconnection structure 100 may include first to fifth pad bonding portions 211, 212, 213, 214 and 215 disposed on the first surface 201 of the substrate body 200. The first to fifth pad bonding portions 211, 212, 213, 214 and 215 may be conductive patterns. The third, first, second, fourth and fifth pad bonding portions 213, 211, 212, 214 and 215 may be sequentially arrayed in a first column intersecting the line X1-X1' of FIG. 3. The circuit interconnection structure 100 may further include a plurality of sixth pad bonding portions 217, and the sixth pad bonding portions 217 may be sequentially arrayed in a second column spaced apart from the first column. The sixth pad bonding portions 217 may be arrayed to face the third, first, second, fourth and fifth pad bonding portions 213, 211, 212, 214 and 215, respectively. In an embodiment, the sixth pad bonding portions 217 may be arrayed to face the third, first, second, fourth and fifth pad bonding portions 213, 211, 212, 214 and 215 in a one-to-one manner whereby a single sixth pad bonding portion 217 faces one of the pad bonding portions from the third, first, second, fourth and fifth pad bonding portions 213, 211, 212, 214 and 215.

The third, first, second, fourth and fifth pad bonding portions 213, 211, 212, 214 and 215 may be electrically connected to the corresponding first outer chip pads (511 of FIG. 1) of the semiconductor chip 500C, respectively. In an embodiment, the third, first, second, fourth and fifth pad bonding portions 213, 211, 212, 214 and 215 are electrically connected to the corresponding first outer chip pads (511 of FIG. 1) in a one-to-one manner whereby a single pad bonding portion (i.e., 213) is electrically connected to a single first outer chip pad (i.e., a corresponding first output chip pad 511). The sixth pad bonding portions 217 may also be electrically connected to the corresponding second outer chip pads (512 of FIG. 1) of the semiconductor chip 500C, respectively. In an embodiment, the sixth pad bonding portions 217 are electrically connected to the corresponding second outer chip pads 512 in a one-to-one manner whereby a single sixth pad bonding portion 217 is electrically connected to a single corresponding second outer chip pad 512. The third, first, second, fourth and fifth pad bonding portions 213, 211, 212, 214 and 215 may be respectively located at positions overlapping with the first outer chip pads (511 of FIG. 1) of the semiconductor chip 500C in a plan view. The sixth pad bonding portions 217 may be respectively located at positions overlapping with the second outer chip pads (512 of FIG. 1) of the semiconductor chip 500C in a plan view. The third, first, second, fourth and fifth pad bonding portions 213, 211, 212, 214 and 215 and the sixth pad bonding portions 217 may be electrically connected to the first and second outer chip pads 511 and 512 of the semiconductor chip 500C through the inner connectors 560, respectively. In an embodiment, the third, first, second, fourth and fifth pad bonding portions 213, 211, 212, 214 and 215 and the sixth pad bonding portions 217 may be electrically connected to the first and second outer chip pads 511 and 512 in a one-to-one manner through the inner connectors 560 in a one-to one manner whereby a single pad bonding portion (i.e. 213) is electrically connected to a single first outer chip pad 511 through a single inner connector 560 and a single sixth pad bonding portion 217 is electrically connected to a single second outer chip pad 512 through a single inner connector 560.

The first inner chip pads 521 of the semiconductor chip 500C may be located to be respectively spaced apart from the third, first, second, fourth and fifth pad bonding portions 213, 211, 212, 214 and 215 by a certain distance when viewed from a plan view. Although the first inner chip pads 521 of the semiconductor chip 500C do not overlap with the third, first, second, fourth and fifth pad bonding portions 213, 211, 212, 214 and 215 in a plan view, the first inner chip pads 521 may be electrically connected to respective ones of the third, first, second, fourth and fifth pad bonding portions 213, 211, 212, 214 and 215 through the first pad connection trace portions 531 and the first outer chip pads 511. The second inner chip pads 522 of the semiconductor chip 500C may be located to be respectively spaced apart from the sixth pad bonding portions 217 by a certain distance when viewed from a plan view. The second inner chip pads 522 may be electrically connected to respective ones of the sixth pad bonding portions 217 through the second pad connection trace portions 532 and the second outer chip pads 512.

The first and second outer chip pads 511 and 512 and the first and second pad connection trace portions 531 and 532 may allow the first to sixth pad bonding portions 211, 212, 213, 214, 215 and 217 to be located at arbitrary positions on the first surface 201 of the substrate body 200. Thus, the third, first, second, fourth and fifth pad bonding portions 213, 211, 212, 214 and 215 may be disposed to be laterally offset relative to the first inner chip pads 521 in a plan view, and the sixth pad bonding portions 217 may be disposed to be laterally offset relative to the second inner chip pads 522 in a plan view. Accordingly, a third distance d3 between the first column in which the first to fifth pad bonding portions 211~215 are arrayed and the second column in which the sixth pad bonding portions 217 are arrayed may be designed to be greater than the first distance d1 between the first inner chip pads 521 and the second inner chip pads 522.

First to fourth via landing portions 231, 232, 233 and 234 may be disposed on the first surface 201 of the substrate body 200 to constitute a portion of the circuit interconnection structure 100. The first to fourth via landing portions 231, 232, 233 and 234 may be disposed to be spaced apart from the first to sixth pad bonding portions 213, 211, 212, 214, 215 and 217 when viewed from a plan view. The first to fourth via landing portions 231, 232, 233 and 234 may be disposed to overlap with the conductive vias (240 of FIG. 1) in a plan view. For example, as illustrated in FIG. 1, the first via landing portion 231 may be disposed to overlap with a first conductive via 241 included in the conductive vias 240 and may be electrically connected to the first conductive via 241.

First to third connection trace portions 251, 252 and 254 and first and second guard trace portions 253 and 255 may be disposed on the first surface 201 of the substrate body 200 to constitute a portion of the circuit interconnection structure 100. The first to third connection trace portions 251, 252 and 254 and first and second guard trace portions 253 and 255 may be line-shaped conductive patterns.

The first connection trace portion 251 may extend to connect the first pad bonding portion 211 to the first via landing portion 231. The second connection trace portion 252 may be connected to the second pad bonding portion 212 and may be disposed to be parallel with the first connection trace portion 251. The third connection trace portion 254 may extend to connect the fourth pad bonding portion 214 to the fourth via landing portion 234. The first to third connection trace portions 251, 252 and 254 may be disposed to be spaced apart from each other by a certain distance. The first to third connection trace portions 251, 252 and 254 may extend to be parallel with each other. In an embodiment, the first to third connection trace portions 251, 252 and 254 may extend to not overlap with one another.

The first guard trace portion 253 may be disposed such that an end portion 253E of the first guard trace portion 253 is spaced apart from and is adjacent to the third pad bonding portion 213. The first guard trace portion 253 may extend to be parallel with the first connection trace portion 251. The first guard trace portion 253 may be disposed at one side of the first connection trace portion 251 opposite to the second connection trace portion 252. The first guard trace portion 253 and the first connection trace portion 251 may be disposed side by side to be spaced apart from each other by a certain distance. The second guard trace portion 255 may be disposed such that an end portion 255E of the second guard trace portion 255 is spaced apart from and is adjacent to the fifth pad bonding portion 215. The second guard trace portion 255 may extend to be parallel with the third connection trace portion 254. The second guard trace portion 255 may be disposed at one side of the third connection trace portion 254 opposite to the second connection trace portion 252.

First and second connection plane portions 271 and 273 may be disposed on the first surface 201 of the substrate body 200 to constitute a portion of the circuit interconnection structure 100. The first and second connection plane portions 271 and 273 may be conductive patterns, each of which has a large planar area as compared to the planar areas of the first connection trace portion 251 and the third connection trace portion 254. The first and second connection plane portions 271 and 273 may be conductive patterns which are electrically isolated from the first and fourth via landing portions 231 and 234.

In an embodiment, the first connection plane portion 271 may be disposed to be spaced apart from the first via landing portion 231 by a certain distance. The first connection plane portion 271 may be disposed to partially surround the first via landing portion 231 in a plan view. In an embodiment, the first connection plane portion 271 may be disposed to be spaced apart from the first via landing portion 231 by at least a certain distance or more while partially surrounding the first via landing portion 231. The first connection plane portion 271 may extend to connect the second connection trace portion 252 to the first guard trace portion 253 and to electrically bypass or circumvent the first via landing portion 231. The first connection plane portion 271 may further extend to connect the second connection trace portion 252 to the second via landing portion 232. The first connection plane portion 271 may be a conductive pattern including the second via landing portion 232. That is, the second via landing portion 232 may correspond to a portion of the first connection plane portion 271.

The first connection plane portion 271 may additionally extend to be spaced apart from the fourth via landing portion 234. The first connection plane portion 271 may extend to partially surround and electrically bypass or circumvent the fourth via landing portion 234 in a plan view. In an embodiment, the first connection plane portion 271 may be disposed to be spaced apart from the fourth via landing portion 234 by at least a certain distance or more while partially surrounding the fourth via landing portion 234. The first connection plane portion 271 may extend to connect the second connection trace portion 252 to the second guard trace portion 255. The first connection plane portion 271 may electrically connect the first and second guard trace portions 253 and 255 to the second via landing portion 232.

The second connection plane portion 273 may be disposed to connect the third pad bonding portion 213 to the third via landing portion 233. The second connection plane portion 273 may be configured to include the third via landing portion 233. That is, the third via landing portion 233 may correspond to a portion of the second connection plane portion 273. The second connection plane portion 273 may extend such that a side surface 273S of the second connection plane portion 273 faces the first, second and fourth pad bonding portions 211, 212 and 214. The second connection plane portion 273 may further extend to connect the fifth pad bonding portion 215 to the third via landing portion 233. The second connection plane portion 273 may be disposed to be spaced apart from the first, second and fourth pad bonding portions 211, 212 and 214 by a certain distance. For example, the second connection plane portion 273 may partially surround and electrically bypass or circumvent the first, second and fourth pad bonding portions 211, 212 and 214 in a plan view.

Referring to FIG. 3, the first guard trace portion 253 and the second connection trace portion 252 may be located at both sides of the first connection trace portion 251, respectively. As used herein for various embodiments, first and second portions located at both sides of a third portion, respectively means that the third portion is located between the first and second portions. For example, the first guard trace portion 253 and the second connection trace portion 252 being located at both sides of the first connection trace portion 251 means that the first connection trace portion 251 is located between the first guard trace portion 253 and the second connection trace portion 252. The second guard trace portion 255 and the second connection trace portion 252 may be located at both sides of the third connection trace portion 254, respectively. The first guard trace portion 253, the first connection trace portion 251, the second connection trace portion 252, the third connection trace portion 254 and the second guard trace portion 255 may be sequentially arrayed in a direction parallel with the first column. Accordingly, the third, first, second, fourth and fifth pad bonding portions 213, 211, 212, 214 and 215 may also be sequentially arrayed in the first column.

The first guard trace portion 253 and the second connection plane portion 273 may be located at both sides of the third pad bonding portion 213, respectively. In addition, the first connection trace portion 251 and the second connection plane portion 273 may be located at both sides of the first pad bonding portion 211, respectively. Because the first via landing portion 231 is connected to the first connection trace portion 251 and the third via landing portion 233 is connected to the second connection plane portion 273, the first via landing portion 231 and the third via landing portion 233 may be located at both sides of the first pad bonding portion 211, respectively. In an embodiment, the first via landing portion 231 is located at first sides of the first to third pad bonding portions 211-213 and the third via landing portion 233 is located at second sides of the first to third pad bonding portions 211-213 opposite to the first via landing portion 231. In an embodiment, the first to third pad bonding portions 211-213 are located between the third via landing portion 233 and the first via landing portion 231.

The second connection trace portion 252 and the second connection plane portion 273 may be located at both sides of the second pad bonding portion 212, respectively. Because the second connection trace portion 252 is connected to the second via landing portion 232 through the first connection plane portion 271, the second via landing portion 232 and the third via landing portion 233 may be located at both sides of the second pad bonding portion 212, respectively. In an embodiment, the second via landing portion 232 is located at first sides of the first to third pad bonding portions 211-213 and the third via landing portion 233 is located at second sides of the first to third pad bonding portions 211-213 opposite to the second via landing portion 232. In an embodiment, the first to third pad bonding portions 211-213 are located between the third via landing portion 233 and the second via landing portion 232.

The second connection plane portion 273 may be located between a first column pad bonding portion comprised of the first to fifth pad bonding portions 211, 212, 213, 214 and 215 arrayed in the first column and a second column pad bonding portion comprised of the sixth pad bonding portions 217 arrayed in the second column. Thus, the first connection plane portion 271 and the second connection plane portion 273 may be located at both sides of the first column pad bonding portion comprised of the first to fifth pad bonding portions 211, 212, 213, 214 and 215, respectively. In an embodiment, the first connection plane portion 271 is located at first sides of the first to third pad bonding portions 211-213 and the second connection plane portion 273 is located at second sides of the first to third pad bonding portions 211-213 opposite to the first connection plane portion 271. In an embodiment, the first to third pad bonding portions 211-213 are located between the first connection plane portion 271 and the second connection plane portion 273.

Referring to FIGS. 1 and 3, the first pad bonding portion 211, the first connection trace portion 251 and the first via landing portion 231 may constitute a first data signal line. The first data signal line may be a signal line transmitting a data signal to the semiconductor chip 500C. The first data signal line may further include the first conductive via 241, a first outer connector landing portion 261 included in the outer connector landing portions 260, and a first outer connector 601 included in the outer connectors 600 which are connected in series to the first via landing portion 231. Similarly, a second data signal line may include the fourth pad bonding portion 214, the third connection trace portion 254 and the fourth via landing portion 234.

Referring to FIGS. 3 and 4, the second pad bonding portion 212, the second connection trace portion 252, the first connection plane portion 271 and the second via landing portion 232 may constitute a ground line. The ground line may provide an electrical path for supplying a ground voltage to the semiconductor chip 500C. As illustrated in FIG. 5, the ground line may further include a second conductive via 242 included in the conductive vias 240, a second outer connector landing portion 262 included in the outer connector landing portions 260, and a second outer connector 602 included in the outer connectors 600 which are connected in series to the second via landing portion 232. The first and second guard trace portions 253 and 255 may also be electrically connected to the ground line through the first connection plane portion 271 to be grounded.

Referring to FIGS. 3 and 5, the third pad bonding portion 213, the second connection plane portion 273 and the third via landing portion 233 may constitute a first power line. The first power line may provide an electrical path for supplying a power voltage to the semiconductor chip 500C. As illustrated in FIG. 4, the first power line may further include a third conductive via 243 included in the conductive vias 240, a third outer connector landing portion 263 included in the outer connector landing portions 260, and a third outer connector 603 included in the outer connectors 600 which are connected in series to the third via landing portion 233. The fifth pad bonding portion 215, the second connection plane portion 273 and the third via landing portion 233 may constitute a second power line.

Referring again to FIGS. 1 and 3, a data signal may be applied to the semiconductor chip 500C through the first data signal line including the first pad bonding portion 211, the first connection trace portion 251 and the first via landing portion 231. Variation of an impedance value of a signal path including the first connection trace portion 251 and the first via landing portion 231 may affect transmission of a data signal which is transmitted through the first connection trace portion 251 and the first via landing portion 231. However, according to an embodiment, all of the first guard trace portion 253, the first connection plane portion 271 and the second connection trace portion 252 surrounding an electrical path including the first connection trace portion 251 and the first via landing portion 231 have the same ground potential. Thus, the impedance variation of the signal path including the first connection trace portion 251 and the first via landing portion 231 may be suppressed.

The first guard trace portion 253, the first connection plane portion 271 and the second connection trace portion 252 may provide a continuous trace structure surrounding the first connection trace portion 251 and the first via landing portion 231. The first guard trace portion 253 may extend to be parallel with the first connection trace portion 251 and may be connected to the first connection plane portion 271. The first connection plane portion 271 may extend to surround the first via landing portion 231 and may be connected to the second connection trace portion 252. The second connection trace portion 252 may extend to be parallel with the first connection trace portion 251. Thus, the first guard trace portion 253, the first connection plane portion 271 and the second connection trace portion 252 may be connected in series to provide a continuous trace structure.

All of the first guard trace portion 253, the first connection plane portion 271 and the second connection trace portion 252 may be grounded, as described above. Accordingly, the structure including the first guard trace portion 253, the first connection plane portion 271 and the second connection trace portion 252 may act as a reference plane of the signal path including the first connection trace portion 251 and the first via landing portion 231. Thus, the structure including the first guard trace portion 253, the first connection plane portion 271 and the second connection trace portion 252 may function as a continuous signal return path without any discontinuous region or a continuous current return path without any discontinuous region for a data signal which is transmitted through the signal path including the first connection trace portion 251 and the first via landing portion 231.

As described above, no discontinuous region exists in the structure including the first guard trace portion 253, the first connection plane portion 271 and the second connection trace portion 252. Thus, the occurrence of the abrupt impedance variation of the signal path including the first connection trace portion 251 and the first via landing portion 231 may be suppressed or alleviated by the continuity of the structure including the first guard trace portion 253, the first connection plane portion 271 and the second connection trace portion 252. In addition, the first guard trace portion 253 and the first connection trace portion 251 may extend to be adjacent and parallel with each other. Accordingly, the impedance variation of the signal path including the first connection trace portion 251 and the first via landing portion 231 may be more significantly suppressed.

If a discontinuous region exists in the structure including the first guard trace portion 253, the first connection plane portion 271 and the second connection trace portion 252, the discontinuous region may cause the abrupt impedance variation of the signal path including the first connection trace portion 251 and the first via landing portion 231. The abrupt impedance variation of the signal path including the first connection trace portion 251 and the first via landing portion 231 may affect transmission of a data signal transmitted through the signal path including the first connection trace portion 251 and the first via landing portion 231. That is, the abrupt impedance variation of the signal path may disturb the transmission of a data signal transmitted through the signal path.

A power signal having a logic "high" level may be supplied to the semiconductor chip 500C through the third pad bonding portion 213. A first data signal may be transmitted through the first pad bonding portion 211. A ground signal having a logic "low" level may be supplied to the semiconductor chip 500C through the second pad bonding portion 212. Thus, the first, second and third pad bonding portions 211, 212 and 213 may respectively function as a power pad, a signal pad and a ground pad and may be disposed to be adjacent to each other. That is, the first, second and third pad bonding portions 211, 212 and 213 may be disposed to be substantially closest to each other. Accordingly, routing distances between the power signal, the data signal and the ground signal, which are applied to the semiconductor chip 500C, may be reduced to improve an operation speed of the semiconductor chip 500C.

Buffer circuits (not shown) for the data signals, the power signal and the ground signal may be provided in or on the chip body (500 of FIG. 1) adjacent to the first inner chip pads (521 and 522 of FIG. 1) of the semiconductor chip (500C of FIG. 1). The buffer circuits may be configured to perform a switching operation. Because the power pad, the signal pads and the ground pads are disposed to be adjacent to each other, routing distances of the power line, the data lines and the ground line connected to the buffer circuits may be reduced. Thus, an operation speed of the buffer circuits may be improved.

Referring again to FIG. 3, the sixth pad bonding portions 217 arrayed in the second column may be disposed to have a symmetric configuration to the first to fifth pad bonding portions 211-215 arrayed in the first column with respect to a straight line between the first and second columns. However, in some other embodiments, the sixth pad bonding portions 217 may be randomly disposed at arbitrary positions to have a non-symmetric configuration to the first to fifth pad bonding portions 211-215.

In FIG. 3, although a third connection plane portion 275 is disposed to have a symmetric configuration to the first connection plane portion 271 with respect to a straight line between the first and second columns, the third connection plane portion 275 may be disposed to have a non-symmetric configuration to the first connection plane portion 271 according to the embodiments.

In FIG. 3, although a third guard trace portion 293 and a fourth guard trace portion 295 are disposed to have a symmetric configuration to the first and second guard trace portions 253 and 255 with respect to a straight line between the first and second columns, the third guard trace portion 293 and the fourth guard trace portion 295 may be disposed to have a non-symmetric configuration to the first and second guard trace portions 253 and 255 according to the embodiments.

In FIG. 3, although a fourth connection trace portion 291, a fifth connection trace portion 292 and a sixth connection trace portion 294 are disposed to have a symmetric configuration to the first, second and third connection trace portions 251, 252 and 254 with respect to a straight line between the first and second columns, the fourth connection trace portion 291, the fifth connection trace portion 292 and the sixth connection trace portion 294 may be disposed to have a non-symmetric configuration to the first, second and third connection trace portions 251, 252 and 254 according to the embodiments.

In FIG. 3, although a fifth via landing portion 281, a sixth via landing portion 282 and a seventh via landing portion 284 are disposed to have a symmetric configuration to the first, second and fourth via landing portions 231, 232 and 234 with respect to a straight line between the first and second columns, the fifth via landing portion 281, the sixth via landing portion 282 and the seventh via landing portion 284 may be disposed to have a non-symmetric configuration according to the embodiments. Referring to FIGS. 1, 2 and 3, a line width of the second connection plane portion 273 in a direction parallel with the line X1-X1' may be restricted by the third distance d3 between the first column in which the first to fifth pad bonding portions 211-215 are arrayed and the second column in which the sixth pad bonding portions 217 are arrayed. The third distance d3 between the first column and the second column may be greater than the first distance d1 between the first inner chip pads 521 and the second inner chip pads 522. The second connection plane portion 273 may be a conductive pattern having a width in a direction parallel with the line X1-X1', which is greater than the first distance d1 between the first inner chip pads 521 and the second inner chip pads 522.

Because the second connection plane portion 273 is a relatively wide conductive pattern as compared to the first, second and third connection trace portions 251, 252 and 254, for example, a resistance value and an impedance value of the second connection plane portion 273 may be lowered to more effectively stabilize the ground voltage or the power voltage induced by a current flowing through the second connection plane portion 273. In addition, a certain space or a certain area may be required to dispose the via landing portions. However, because the second connection plane portion 273 is a relatively wide conductive pattern as compared to the first, second and third connection trace portions 251, 252 and 254, for example, the third via landing portion 233 may be located in a region of the second connection plane portion 273 in a plan view. That is, the third conductive via 243 may be disposed to overlap with the second connection plane portion 273 in a plan view. Thus, a routing length of an electrical path between the third conductive via 243 and the second connection plane portion 273 may be remarkably reduced to improve the reliability and electrical characteristics of the semiconductor package 10.

If the third distance between the first and second columns is equal to the first distance d1, it may be difficult to increase the width of the second connection plane portion. In such a case, a resistance value of the second connection plane portion may increase. That is, if the third distance between the first and second columns is designed to be equal to the first distance d1, it may be difficult to dispose the third conductive via between the first column and the second column. Accordingly, because the third conductive via is disposed to be laterally offset relative to the second connection plane portion, a routing length of an electrical path between the third conductive via and the second connection plane portion may increase to degrade the reliability and electrical characteristics of the semiconductor package 10.

As described above, according to an embodiment, the second connection plane portion 273 may be a relatively wide conductive pattern as compared to the first, second and third connection trace portions 251, 252 and 254, for example and the third conductive via 243 may be designed to overlap with the second connection plane portion 273 in a plan view. Thus, the power voltage or the ground voltage may be efficiently supplied to the semiconductor chip 500C through the third conductive via 243 and the second connection plane portion 273.

Figure 6:
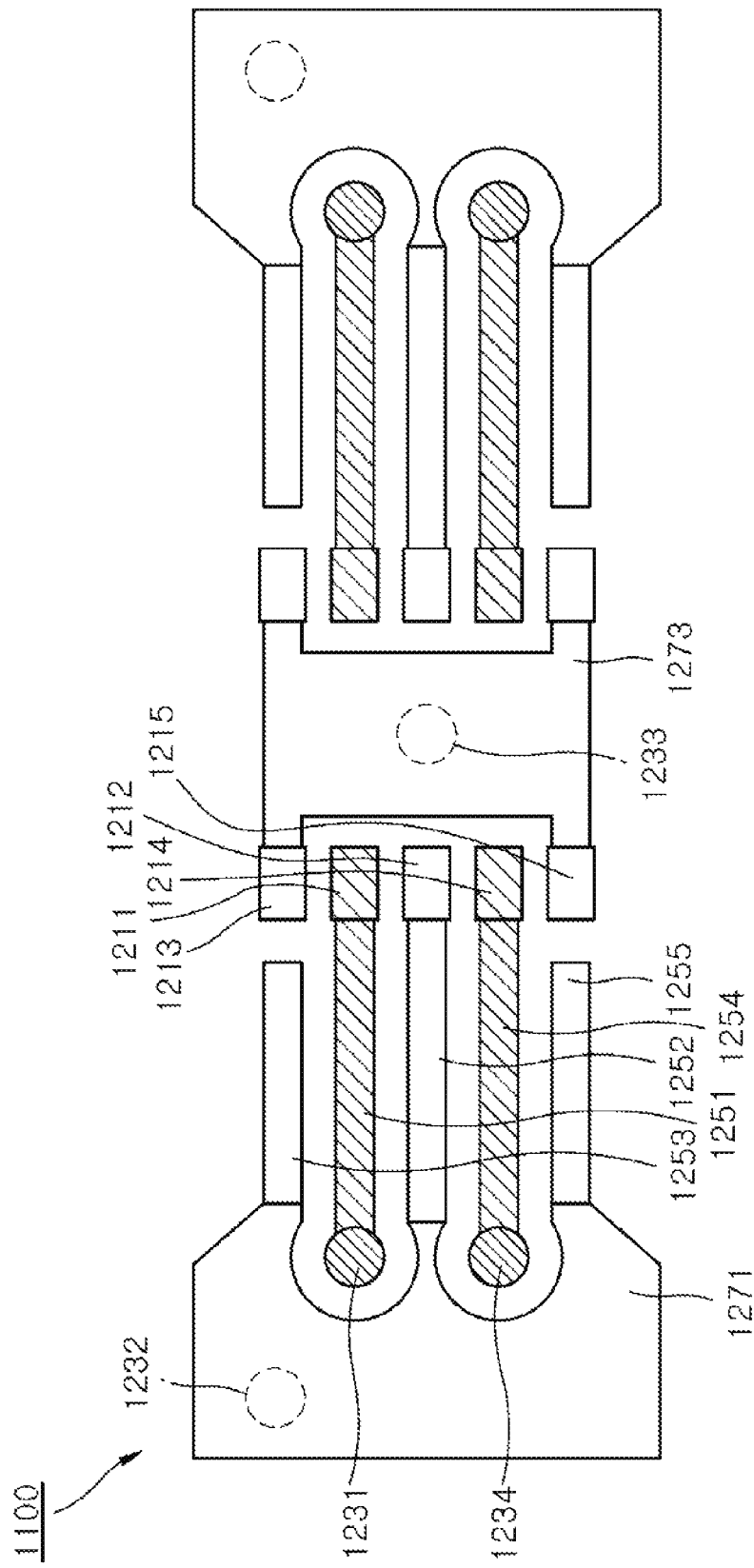
FIG. 6 is a plan view illustrating an example of a circuit interconnection structure included in a semiconductor package according to an embodiment.

FIG. 6 is a plan view illustrating another circuit interconnection structure 1100 employed in a semiconductor package according to an embodiment.

Referring to FIG. 6, the circuit interconnection structure 1100 may include first to fifth pad bonding portions 1211, 1212, 1213, 1214 and 1215, first to third connection trace portions 1251, 1252 and 1254, first and second guard trace portions 1253 and 1255, first to fourth via landing portions 1231, 1232, 1233 and 1234, and first and second connection plane portions 1271 and 1273.

The first pad bonding portion 1211, the first connection trace portion 1251 and the first via landing portion 1231 may constitute a first data signal line. The fourth pad bonding portion 1214, the third connection trace portion 1254 and the fourth via landing portion 1234 may constitute a second data signal line.

The second pad bonding portion 1212, the second connection trace portion 1252, the first connection plane portion 1271 and the second via landing portion 1232 may constitute a power line. The first and second guard trace portions 1253 and 1255 may also be electrically connected to the first connection plane portion 1271 to act as a portion of the power line.

When a first data signal is transmitted through the first via landing portion 1231 and the first connection trace portion 1251, the first guard trace portion 1253, the second connection trace portion 1252 and the first connection plane portion 1271 may act as a signal return path. The first guard trace portion 1253, the second connection trace portion 1252 and the first connection plane portion 1271 may be provided to suppress the impedance variation of the first connection trace portion 1251 or to reduce an amount of the impedance variation of the first connection trace portion 1251. When a second data signal is transmitted through the fourth via landing portion 1234 and the third connection trace portion 1254, the second guard trace portion 1255, the second connection trace portion 1252 and the first connection plane portion 1271 may act as a signal return path. The second guard trace portion 1255, the second connection trace portion 1252 and the first connection plane portion 1271 may be provided to suppress the impedance variation of the third connection trace portion 1254 or to reduce an amount of the impedance variation of the third connection trace portion 1254.

The third pad bonding portion 1213, the second connection plane portion 1273 and the third via landing portion 1233 may constitute a first ground line. The fifth pad bonding portion 1215, the second connection plane portion 1273 and the third via landing portion 1233 may constitute a second ground line.

Figure 7:
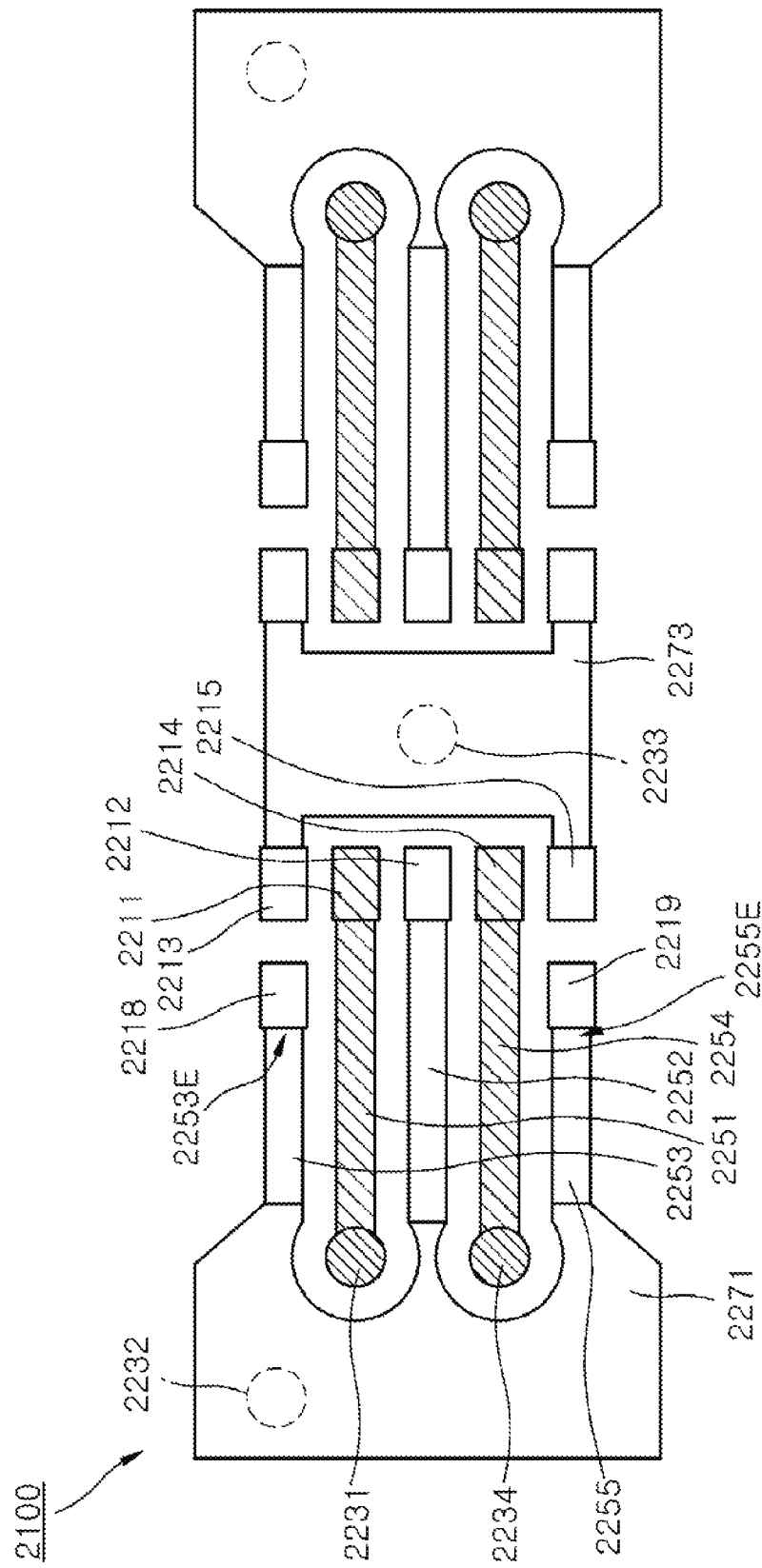
FIG. 7 is a plan view illustrating an example of a circuit interconnection structure included in a semiconductor package according to an embodiment.

FIG. 7 is a plan view illustrating yet another circuit interconnection structure 2100 employed in a semiconductor package according to an embodiment.

Referring to FIG. 7, the circuit interconnection structure 2100 may include first to fifth pad bonding portions 2211, 2212, 2213, 2214 and 2215, first to third connection trace portions 2251, 2252 and 2254, first and second guard trace portions 2253 and 2255, first to fourth via landing portions 2231, 2232, 2233 and 2234, and first and second connection plane portions 2271 and 2273.

A first additional pad bonding portion 2218 may be connected to an end portion 2253E of the first guard trace portion 2253 to face the third pad bonding portion 2213. The first additional pad bonding portion 2218 may have substantially the same shape as the third pad bonding portion 2213 facing the first additional pad bonding portion 2218. An additional inner connector (not shown) having the same shape as the inner connectors (560 of FIG. 1) may be bonded to the first additional pad bonding portion 2218. Thus, the first additional pad bonding portion 2218 may be electrically connected to the semiconductor chip (500C of FIG. 1).

A second additional pad bonding portion 2219 may be connected to an end portion 2255E of the second guard trace portion 2255 to face the fifth pad bonding portion 2215. The second additional pad bonding portion 2219 may have substantially the same shape as the fifth pad bonding portion 2215 facing the second additional pad bonding portion 2219. An additional inner connector (not shown) having the same shape as the inner connectors (560 of FIG. 1) may be bonded to the second additional pad bonding portion 2219. Thus, the second additional pad bonding portion 2219 may also be electrically connected to the semiconductor chip (500C of FIG. 1).

Figure 8:
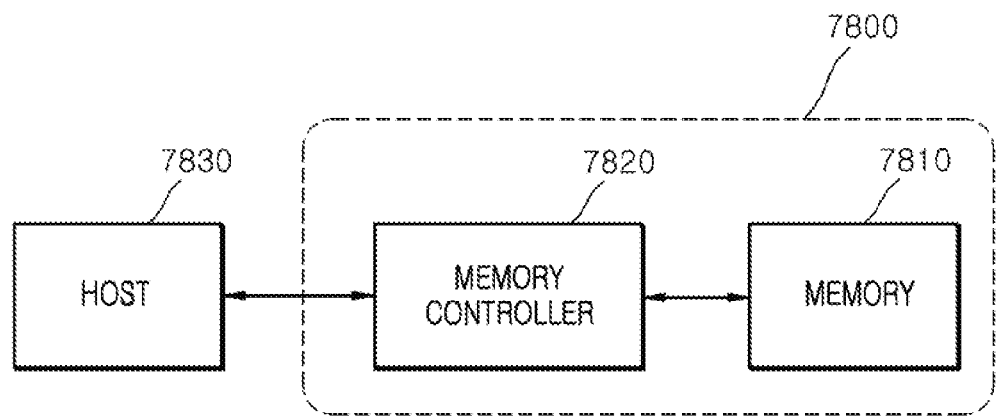
FIG. 8 is a block diagram illustrating an electronic system employing a memory card including a semiconductor package according to an embodiment.

FIG. 8 is a block diagram illustrating an electronic system including a memory card 7800 employing the semiconductor package according to the embodiments. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include the semiconductor package according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
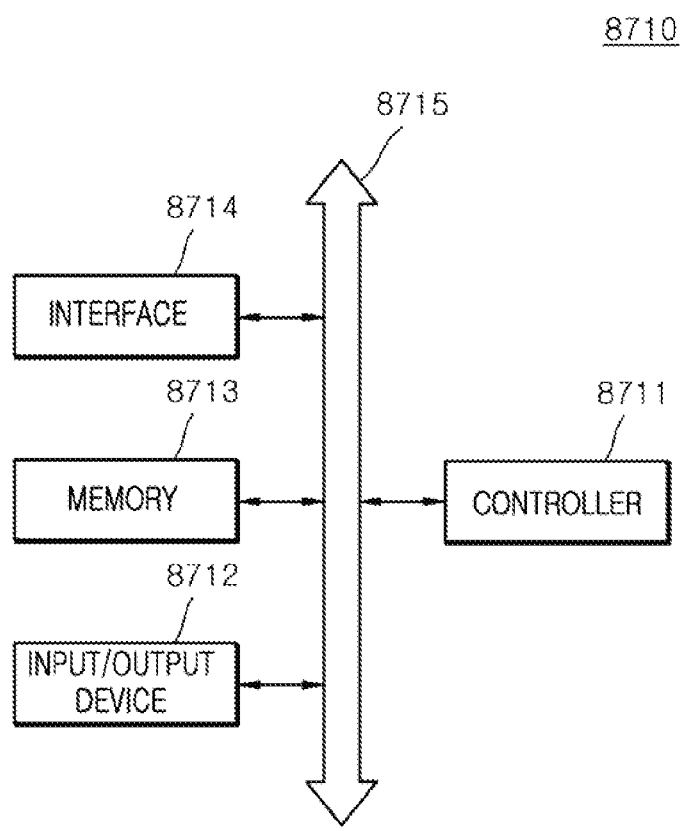
FIG. 9 is a block diagram illustrating an electronic system including a semiconductor package according to an embodiment.

FIG. 9 is a block diagram illustrating an electronic system 8710 including the semiconductor packages according to the embodiments. The electronic system 8710 may include a controller 8711, an input/output device 8712 and a memory 8713. The controller 8711, the input/output device 8712 and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a package substrate including a substrate body; and
    a semiconductor chip mounted on the package substrate,
    wherein the package substrate includes:
        second and third pad bonding portions disposed on the substrate body and respectively located at both sides of a first pad bonding portion, the first pad bonding portion disposed on the substrate body;
        first, second and third via landing portions disposed on the substrate body to be spaced apart from the first, second third pad bonding portions;
        a first connection trace portion extending to connect the first pad bonding portion to the first via landing portion;
        a second connection trace portion connected to the second pad bonding portion, the second connection trace portion being substantially parallel with the first connection trace portion;
        a first guard trace portion having an end portion spaced apart from the third pad bonding portion and the first guard trace portion extending to be substantially parallel with the first connection trace portion;
        a first connection plane portion spaced apart from the first via landing portion, surrounding and electrically bypassing the first via landing portion to connect the second connection trace portion to the first guard trace portion, and connecting the second connection trace portion to the second via landing portion; and
        a second connection plane portion connecting the third pad bonding portion to the third via landing portion, and
    wherein the semiconductor chip includes:
        a chip body;
        first inner chip pads disposed on a surface of the chip body;
        first outer chip pads disposed on the surface of the chip body to be spaced apart from the first inner chip pads, disposed to respectively overlap with the first to third pad bonding portions, and connected to respective ones of the first to third pad bonding portions; and
        first pad connection trace portions connecting the first inner chip pads to the first outer chip pads.

2. The semiconductor package of claim 1, wherein the first guard trace portion and the second connection trace portion are located at both sides of the first connection trace portion, respectively.

3. The semiconductor package of claim 1, wherein the first guard trace portion and the second connection plane portion are located at both sides of the third pad bonding portion, respectively.

4. The semiconductor package of claim 1, wherein the first connection trace portion and the second connection plane portion are located at both sides of the first pad bonding portion, respectively.

5. The semiconductor package of claim 1, wherein the second connection trace portion and the second connection plane portion are located at both sides of the second pad bonding portion, respectively.

6. The semiconductor package of claim 1, wherein the first guard trace portion is extended in a direction, the first connection trace portion is extended in a direction, and the first guard trace portion and first connection trace portion are spaced apart from each other.

7. The semiconductor package of claim 1, wherein the first connection plane portion is spaced apart from the first via landing portion.

8. The semiconductor package of claim 1,
    wherein the first via landing portion is located at first sides of the first to third pad bonding portions; and wherein the third via landing portion is located at second sides of the first to third pad bonding portions opposite to the first sides.

9. The semiconductor package of claim 1,
wherein the second via landing portion is located at first sides of the first to third pad bonding portions; and
wherein the third via landing portion is located at second sides of the first to third pad bonding portions opposite to the first sides.

10. The semiconductor package of claim 1,
wherein the first connection plane portion is located at first sides of the first to third pad bonding portions; and
wherein the second connection plane portion is located at second sides of the first to third pad bonding portions opposite to the first sides.

11. The semiconductor package of claim 1, wherein the first via landing portion, the first connection trace portion and the first pad bonding portion constitute a data signal line for transmitting a data signal to the semiconductor chip.

12. The semiconductor package of claim 11, wherein the second via landing portion, the first connection plane portion, the second connection trace portion and the second pad bonding portion constitute a ground line for supplying a ground voltage to the semiconductor chip.

13. The semiconductor package of claim 12, wherein the third via landing portion, the second connection plane portion and the third pad bonding portion constitute a power line for supplying a power voltage to the semiconductor chip.

14. The semiconductor package of claim 11, wherein the second via landing portion, the first connection plane portion, the second connection trace portion and the second pad bonding portion constitute a power line for supplying a power voltage to the semiconductor chip.

15. The semiconductor package of claim 14, wherein the third via landing portion, the second connection plane portion and the third pad bonding portion constitute a ground line for supplying a ground voltage to the semiconductor chip.

16. The semiconductor package of claim 1, further comprising:
fourth and fifth pad bonding portions disposed on the substrate body;
a fourth via landing portion disposed on the substrate body to be spaced apart from the fourth pad bonding portion;
a third connection trace portion extending to connect the fourth pad bonding portion to the fourth via landing portion; and
a second guard trace portion having an end portion spaced apart from the fifth pad bonding portion and the second guard trace portion extending to be substantially parallel with the third connection trace portion,
wherein the first connection plane portion is spaced apart from the fourth via landing portion and is surrounding and electrically bypassing the fourth via landing portion to connect the second connection trace portion to the second guard trace portion, and
wherein the second connection plane portion is extended to connect the fifth pad bonding portion to the third via landing portion.

17. The semiconductor package of claim 16, wherein the first, second, third, fourth and fifth pad bonding portions are arrayed in a first column.

18. The semiconductor package of claim 17, further comprising a plurality of sixth pad bonding portions disposed on the substrate body and arrayed in a second column which is spaced apart from the first column,
wherein the second connection plane portion is located between the first column and the second column.

19. The semiconductor package of claim 18, wherein the semiconductor chip further includes:
second outer chip pads disposed on the chip body to overlap with the sixth pad bonding portions and connected to respective ones of the sixth pad bonding portions;
second inner chip pads disposed on the chip body to be spaced apart from the second outer chip pads and to face the first inner chip pads; and
second pad connection trace portions connecting the second inner chip pads to the second outer chip pads.

20. The semiconductor package of claim 19, wherein a first distance between the first inner chip pads and the second inner chip pads is less than a second distance between the first outer chip pads and the second outer chip pads.

* * * * *